(12) United States Patent
Gerber et al.

(10) Patent No.: US 8,304,285 B2
(45) Date of Patent: Nov. 6, 2012

(54) ARRAY-MOLDED PACKAGE-ON-PACKAGE HAVING REDISTRIBUTION LINES

(75) Inventors: Mark A Gerber, Lucas, TX (US); David N Walter, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/080,435

(22) Filed: Apr. 5, 2011

(65) Prior Publication Data

US 2011/0183465 A1  Jul. 28, 2011

Related U.S. Application Data

(62) Division of application No. 11/767,294, filed on Jun. 22, 2007, now Pat. No. 7,944,034.

(51) Int. Cl.
 *H01L 21/60* (2006.01)
(52) U.S. Cl. ........ 438/108; 438/107; 438/113; 438/127; 257/680; 257/777; 257/E21.511
(58) Field of Classification Search ............... 438/107, 438/108, 113, 127; 257/680, 686, 723, 773, 257/774, 777, 778, E21.504, E21.505, E21.511, 257/E21.599, E21.602, E23.01, E23.003, 257/E23.021, E23.124
See application file for complete search history.

(56) References Cited

U.S. PATENT DOCUMENTS

| | | | |
|---|---|---|---|
| 6,331,737 | B1 | 12/2001 | Lim et al. |
| 6,933,176 | B1 | 8/2005 | Kirloskar et al. |
| 7,675,152 | B2 | 3/2010 | Gerber et al. |
| 8,093,697 | B2 * | 1/2012 | Haba et al. .............. 257/678 |
| 2006/0172461 | A1 | 8/2006 | Karnezos |

OTHER PUBLICATIONS

Gerber et al., U.S. Appl. No. 11/750,757, "Method for Fabricating Array-Molded Package-on-Package", filed May 18, 2007.
Gerber et al., U.S. Appl. No. 13/050,177, "Method for Fabricating Array-Molded Package-on-Package", filed Mar. 17, 2011.

* cited by examiner

*Primary Examiner* — Hsien Ming Lee
*Assistant Examiner* — Walter H Swanson
(74) *Attorney, Agent, or Firm* — Steven A. Shaw; W. James Brady; Frederick J. Telecky, Jr.

(57) ABSTRACT

A semiconductor device with a sheet-like insulating substrate (101) integral with two or more patterned layers of conductive lines and vias, a chip attached to an assembly site, and contact pads (103) in pad locations has an encapsulated region on the top surface of the substrate, extending to the edge of the substrate, enclosing the chip, and having contact apertures (703) at the pad locations for external communication with the pad metal surfaces. The apertures may have not-smooth sidewall surfaces and may be filled with solder material (704) to contact the pads. Metal-filled surface grooves (710) in the encapsulated region, with smooth groove bottom and sidewalls, are selected to serve as customized routing interconnections, or redistribution lines, between selected apertures and thus to facilitate the coupling with another semiconductor device to form a package-on-package assembly.

21 Claims, 9 Drawing Sheets

ARRAY-MOLDED PACKAGE-ON-PACKAGE HAVING REDISTRIBUTION LINES

This is a divisional of application Ser. No. 11/767,294 filed Jun. 22, 2007, the contents of which are herein incorporated by reference in its entirety.

FIELD OF THE INVENTION

The present invention is related in general to the field of semiconductor devices and processes and more specifically to the structure and fabrication method of low-profile, vertically integrated package-on-package integrated circuit assemblies having redistribution lines.

DESCRIPTION OF THE RELATED ART

Today's package-on-package semiconductor devices enjoy increasing popularity, because they promise to use components already developed and thus quickly available, they are supposed retain a slim space-saving contour after assembly, and they are expected to be robust in terms of reliability in use-test under variable temperature and moisture conditions. These expectations tend to run quickly into difficulties for various reasons.

The thickness of the package-on-package products as the simple sum of the thicknesses of the semiconductor chips, electric interconnections, and encapsulations is often unacceptably large, especially for hand-held wireless equipments. In contrast, when the thickness is reduced, the products run increasingly into warpage problems caused by the mismatch in the coefficients of thermal expansion (CTE) between the semiconductor chip, the plastic substrates, the molding compound, the solder balls, and the printed circuit board. Warpage can lead to some of the most debilitating problems encountered by semiconductor assemblies such as the fracture and separation of solder joints, or the separation of materials followed by moisture ingress.

In addition, the selection of partners for package-on-package products is often limited because their electrical interconnection has to be customized and may require additional metal levels.

SUMMARY OF THE INVENTION

Applicants recognize an existing need to shrink semiconductor devices both in two and in three dimensions, especially for a device-stacking and package-on-package method for semiconductor devices as well as electronic systems. Specifically, applicants recognize an existing need to design production equipment such as molds to provide flexibility in electrical device interconnection of package-on-package devices.

The invention solves the problem by a versatile mold with exchangeable device-specific inserts. These versatile molds further provide low-cost, simplified fabrication methods, and improved testability and thus yield. Using these flexible molds, stacking chips and packages will shorten the time-to-market of innovative products such as vertically integrated semiconductor systems, which utilize available chips of various capabilities (for example processors and memory chips), eliminating the wait for a redesign of chips.

Based on the versatile mold equipment, package-on-package devices can be produced with excellent electrical performance, mechanical stability free of warping, and high product reliability. Further, it is a technical advantage that the fabrication method is flexible enough to be applied for different semiconductor product families and a wide spectrum of design and process variations.

Based on the redistribution lines on the surface of the molding compound, the invention provides an electrical routing level outside of the insulating substrate or the leadframe, thus providing the additional routing without adding a metallization level to the thickness of the package.

One embodiment of the invention is a semiconductor device with a sheet-like insulating substrate integral with two or more patterned layers of conductive lines and vias, a chip or a stack of chips attached to an assembly site, and contact pads in pad locations. An encapsulated region is on the top surface of the substrate, extending to the edge of the substrate, enclosing the chip, and having contact apertures at the pad locations for external communication with the pad metal surfaces. The apertures may have not-smooth sidewall surfaces and may be filled with solder material to contact the pads. Surface grooves in the encapsulated region, which have smooth bottom and sidewalls and are filled with metal, are selected to serve as customized routing interconnections, or redistribution lines, between selected apertures and thus to facilitate the coupling with another semiconductor device to form a package-on-package assembly. In addition, electrical parts such as passive components may be attached to the redistribution lines.

Another embodiment of the invention is a mold with top and bottom portions, wherein the top portion forms a cavity for placing semiconductor devices. The device includes a semiconductor chip attached to a sheet-like insulating substrate integral with two or more patterned layers of conductive lines and vias, and contact pads in pad locations. The top mold portion of the mold includes protrusions and recesses; the protrusions are at locations matching the pad locations, and are shaped as truncated cones of a height suitable to approach the pad metal surface in the closed mold.

Placed in the recesses are inserts made of aluminum or steel with ridges operable to create surface grooves in the molded package; in addition, there may be a compliant film inserted in each recess between the top portion and the insert to prevent molding compound from bleeding during the molding operation. Alternatively, a continuous compliant film may cover the top portion surface, including the recesses, to cushion the inserts. The bottom mold portion is without corresponding protrusions and recesses.

Another embodiment of the invention is a method for fabricating a semiconductor device. A semiconductor chip is attached to a sheet-like insulating substrate, preferably integral with two or more patterned layers of conductive lines and vias, and contact pads in pad locations. A mold is provided, which has a top portion with protrusions and recesses; the protrusions are at locations matching the pad locations; placed in the recesses are inserts with ridges operable to create surface grooves in the molded package. The bottom mold portion is without corresponding protrusions. The substrate with the chip is loaded onto the bottom mold portion; the mold is closed by clamping the top portion onto the bottom portion so that the protrusions are aligned with the contact pads, approaching the pad surface. After pressuring molding compound into the cavity to fill the cavity and thereby create an encapsulation, the mold is opened. The encapsulation has apertures to the pad locations and surface grooves (with smooth sidewalls and bottom) extending between selected apertures. Any residual compound may be removed from the pads, and the apertures filled with solder.

Further, the grooves may be filled with a metal such as copper, thereby creating routing interconnections between selected apertures.

Alternatively, the cavity direct injection mold technique, or the liquid compression mold technique may be employed.

The technical advances represented by certain embodiments of the invention will become apparent from the following description of the preferred embodiments of the invention, when considered in conjunction with the accompanying drawings and the novel features set forth in the appended claims.

BRIEF DESCRIPTION OF THE DRAWINGS

FIGS. 1A to 7 illustrate certain process steps for fabricating an array-molded semiconductor device according to an embodiment of the invention.

DETAILED DESCRIPTION OF THE PREFERRED EMBODIMENTS

Figures 1A, 1B:
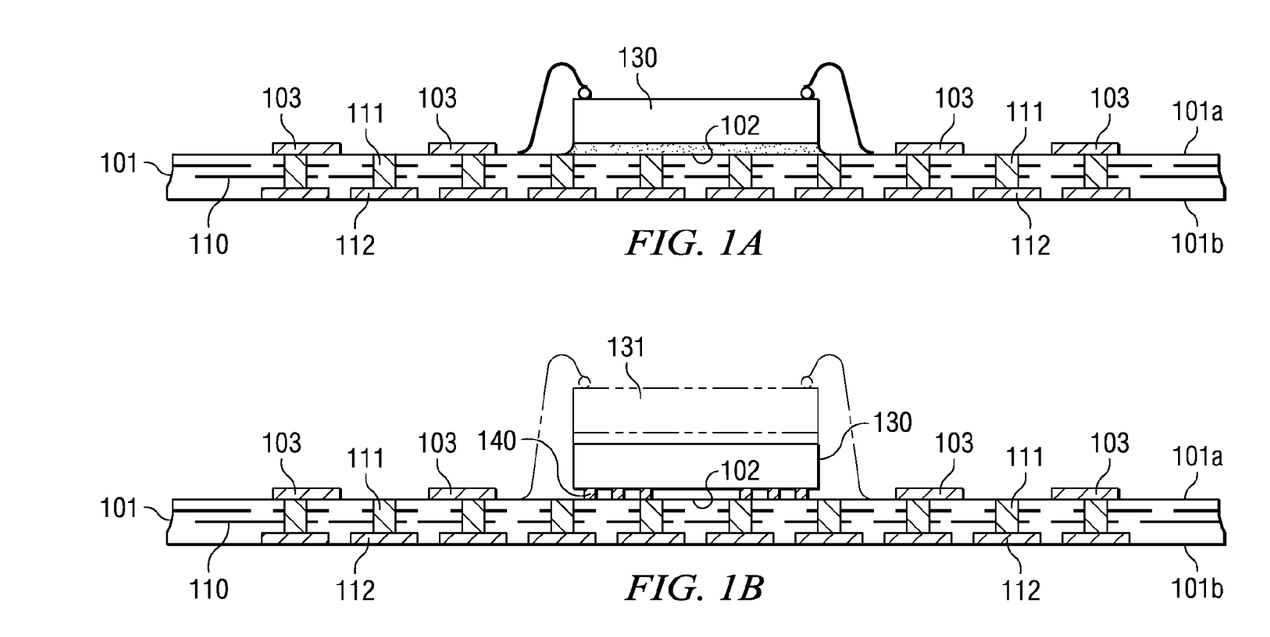
FIG. 1A is a schematic cross section of a substrate with contact pads and a semiconductor chip assembled by wire bonding.
FIG. 1B is a schematic cross section of a substrate with contact pads and a semiconductor chip assembled by flip-chip technology.

FIGS. 1A through 7 illustrate schematically the steps of one embodiment of the present invention, a method for array-molding semiconductor devices. The steps shown in FIGS. 1A and 1B show the attachment and assembly of a semiconductor chip on a substrate by wire bonding (FIG. 1A) and by flip-chip technology (FIG. 1B); FIG. 1C exemplifies a portion of an array of chips attached by flip-chip. A sheet-like substrate 101 with insulating core (for example, plastic, glass-fiber reinforced, ceramic) is integral with two or more patterned layers of conductive lines and conductive vias 111 (preferably copper) and contact pads in pad locations (lines 110 do not reach beyond the boundaries of substrate 101). Substrate 101 has a first surface 101a and a second surface 101b, and a preferred thickness range from 0.05 to 0.5 mm. The first surface 101a includes chip assembly sites 102 and contact pads 103 in pad locations. The metal of the contact pads is preferably copper with a solderable surface (for example, including a layer of gold or palladium). Second surface 101b also has pads 112 with a solderable surface.

Figure 1C:
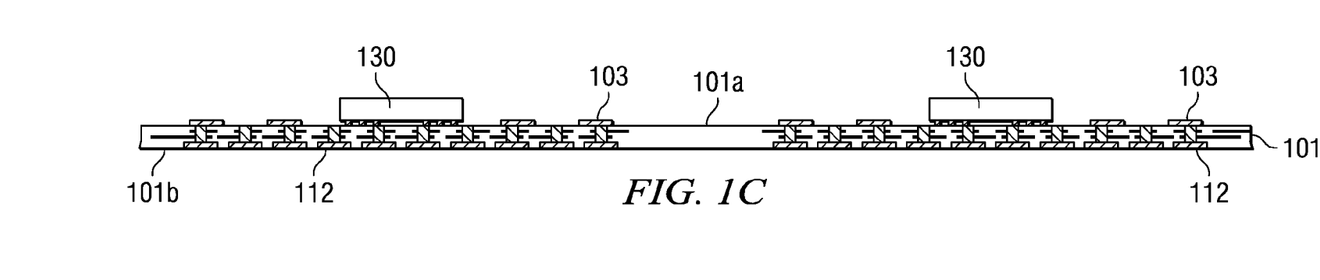
FIG. 1C is a schematic cross section of a sheet-like substrate with contact pads and a plurality of chips flip-assembled for array processing.

A plurality of semiconductor chips 130 is provided. In order to attach and electrically connect the chips, they are assembled on each assembly site either by adhesive attachment and wire bonding, or by flip-chip connection. For flip-attachment, the connecting metal bumps 140 may be made of solder, gold, or copper.

By further attaching the additional chip 131 to chip 130, FIG. 1B illustrates the possibility, to assemble a stack of two or more chips on substrate 101. In this assembly process, both the techniques of flip-chip and wire bond may have to be employed; in emerging technology, also through-semiconductor vias (TSVs, metal-filled vias) may be employed.

Figure 2A:
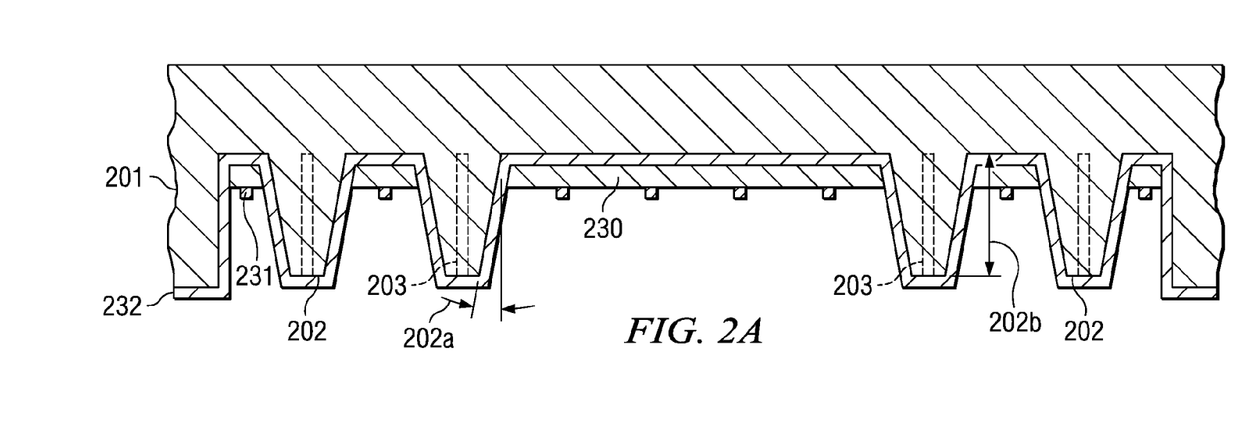
FIG. 2A shows a schematic cross section of the top portion of an exemplary mold with structural features and inserts according to the invention.

As illustrated in FIG. 2A to 3B, in the next process step a mold made of steel or another suitable material is provided, which allows the encapsulation of a single device or of an array of devices. The mold has a top portion and a bottom portion; the top portion is manufactured to form a cavity for holding semiconductor devices. The top portion included protrusions and recesses; the bottom portion is without corresponding protrusions. In FIG. 2A, the top portion is intended to process a single device and is designated 201; in FIG. 2B, the top portion is constructed for an array of devices to be processed together as a batch. In FIG. 3A, the bottom portion is intended to process a single device and is designated 301; in FIG. 2B, the bottom portion is constructed for an array of devices to be processed together.

The top portion 201 includes protrusions 202 at locations matching the pad locations of the device shown in FIGS. 1A and 1B; the bottom portion 301 is without corresponding protrusions. The protrusions are preferably shaped as truncated cones, with the cone surface angled within a preferred range from about 10 to 30 degrees from vertical. The angle is designated 202a in FIG. 2A. Furthermore, the protrusions preferably may have a ridge 203, which may extend along the whole angled side of the cone. Ridge 203 is operable to create a groove or channel in the molded part, which may provide release of gas in the solder ball attachment process, or help in the solder paste reflow process.

The height 202b of the protrusion is selected to be suitable to approach the substrate pad metal (103 in FIGS. 1A and 1B) in the closed mold. Preferably, the protrusion should approach the pad metal surface in the closed mold to a distance between 0 and about 100 µm. More preferably, height 202b of the protrusion is sufficient to touch the pad metal surface in the closed mold.

Figure 3A:
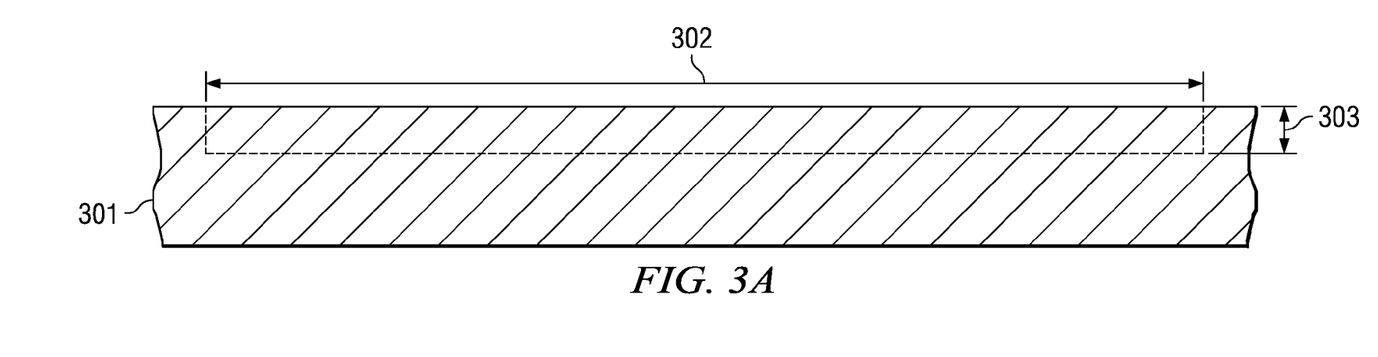
FIG. 3A shows a schematic cross section of the bottom portion of a mold.
Figure 3B:
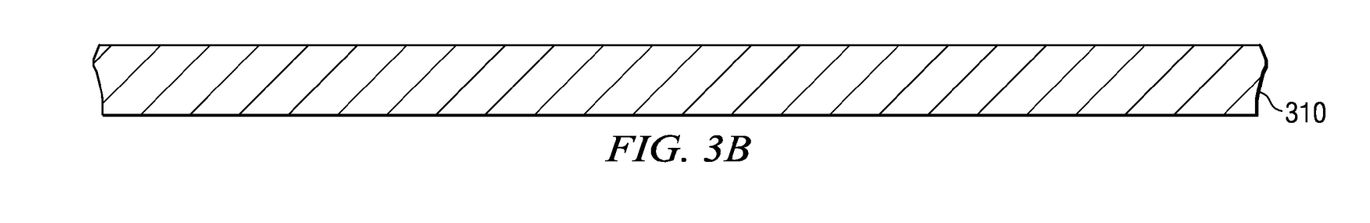
FIG. 3B shows a schematic cross section of the bottom portion of a mold intended for array-molding.
Figure 4:
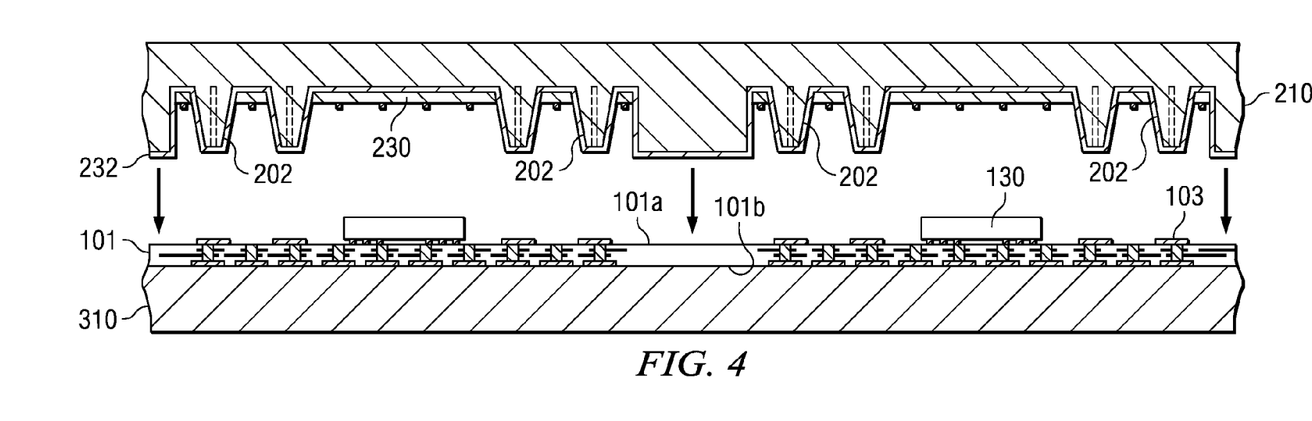
FIG. 4 illustrates a schematic cross section of the open mold according to an embodiment of the invention, loaded with a substrate assembled with semiconductor devices.

The bottom portion 301 in FIGS. 3A and 310 in FIG. 3B of the mold has no protrusions; it is featureless and preferably flat. For some individual devices, it may be an advantage to recess a portion outlined by length 302 and depth 303 sufficient to accommodate the substrate of a discrete device, but for array processing, a featureless flat bottom mold portion is preferable.

The recesses of top portion 201 have inserts 230, which are individually manufactured to fit into the respective recess. They are preferably made of aluminum, steel, or invar so that they can withstand the temperatures and pressures during the molding operation without jamming. The surfaces of the inserts are smooth. Selected inserts have ridges 231, also with smooth surfaces, operable to create surface grooves in the molded package. The preferred height of these ridges is between about 10 and 100 μm. In terms of cross section, the ridges may be rectangular, triangular, or rounded.

Figure 2B:
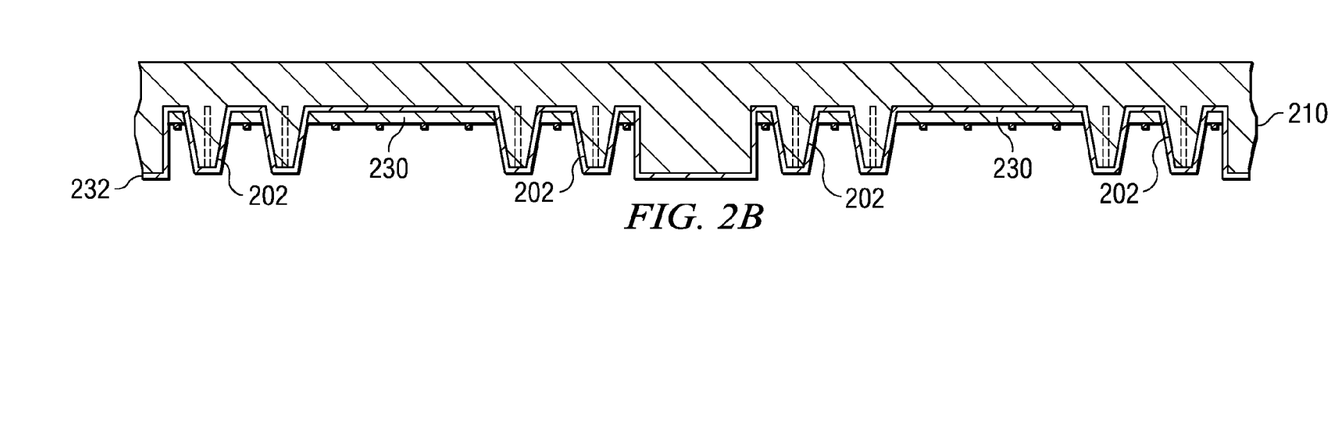
FIG. 2B shows a schematic cross section of the top portion of an exemplary mold intended for array-molding with structural features and inserts according to the invention.

The grooves molded by the ridges 231 will have the mirror-image cross sections of the ridges, such as rectangular, triangular, or rounded, and also will have the smooth surfaces of the ridges. In either case, the grooves will be filled with metal such as copper (see below) in order to create conductive redistribution lines between selected apertures to the contact pads. Consequently, it is a technical advantage of the invention that these inserts can be exchanged between molding runs in order to create any desired redistribution pattern of the connection lines in the molded product. This degree of freedom allows a wide choice in selecting semiconductor devices to be joined with the device packaged in the mold of FIGS. 2A and 3A. FIG. 2B illustrates the inserts 230 in each recess of a top mold 210 intended for molding an array.

As FIGS. 2A and 2B show, it is preferred to insert a continuous compliant, chemically inert film 232 over the surface of top portion 201. Film 232 is positioned between the material of top portion 201 and the inserts 230 to prevent bleeding of molding compound during the molding operation. Preferably, film 232 is adhesive; it is preferably made of heat-tolerant and pressure-tolerant silicone or polymers such as kapton in the thickness range between 15 and 500 μm. Alternatively, pieces of the compliant, chemically inert, preferably adhesive film 232 may be inserted into each recess.

In the next process step (see FIG. 4), the substrate 101 with the assembled chips 130 is loaded onto the bottom mold portion 310. The second substrate surface 101b is rested on bottom mold portion 310, and the first substrate surface 101a with the contact pads 103 is positioned away from the bottom mold portion 310. Protrusions 202 of the top mold portion 210 are aligned with the respective contact pads 103 of substrate 101.

Figure 5:
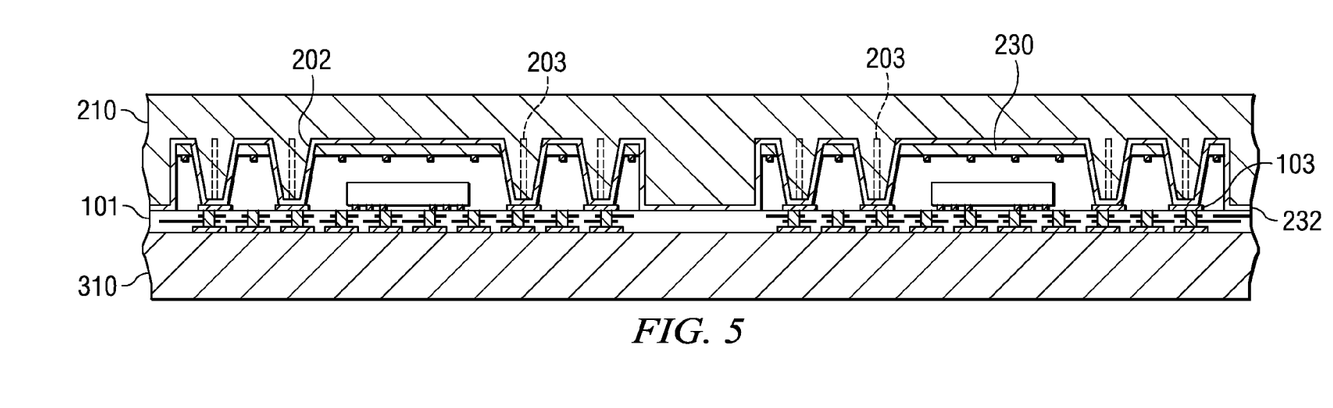
FIG. 5 shows a schematic cross section of the closed mold according to an embodiment of the invention, loaded with a substrate assembled with semiconductor devices.

FIG. 5 shows the next process step of closing the mold by clamping the top mold portion 210 onto the bottom mold portion 310 so that the protrusions 202 are aligned with the contact pads 103, approaching or touching the pad surface. The top portion 210 resting on the flat bottom mold portion 310 forms the cavity of the mold for holding the semiconductor devices. Preferably, the protrusions touch the contact pads; however, material or alignment tolerances may cause a residual distance between 0 and about 100 μm between the protrusion and the respective pad. FIG. 5 also shows the respective ridge 203 for each protrusion 202 and the inserts 230 with the compliant film 232 over the protrusions-and-recess surface of top mold portion 210.

Next, encapsulation material such as epoxy-based and filler-loaded molding compound is pressured into the cavity to fill the cavity; the runners for supplying the compound, and the gates needed for entering the cavity and controlling the compound flow, are not shown in FIG. 5. By this transfer molding step, encapsulations for the devices of the array are created.

Figure 6A:
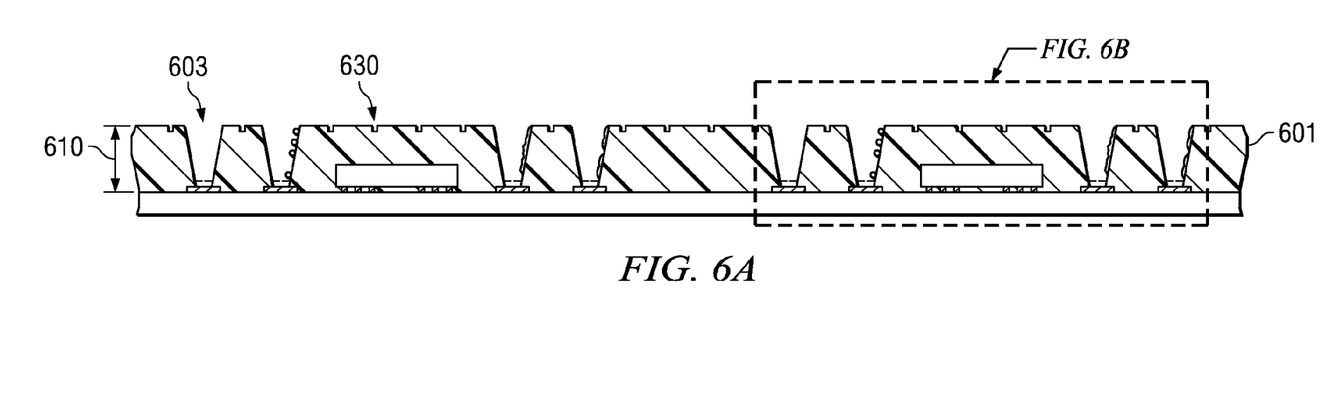
FIG. 6A illustrates a schematic cross section of a molded semiconductor array after removal from the mold.
Figure 6B:
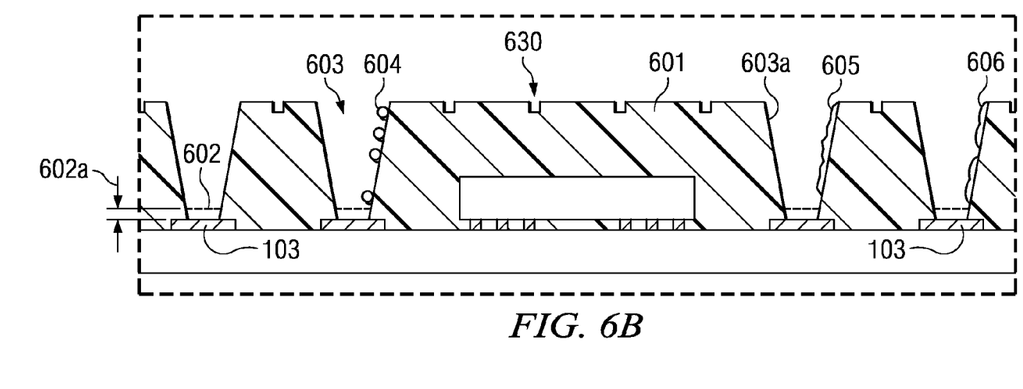
FIG. 6B shows a magnified schematic cross section of a molded unit after removal from the mold and singulation from the array, displaying the grooves in the encapsulation according to the invention.

After partially polymerizing the compound 601, the mold is opened and the substrate together with the encapsulated array of chips is removed from the mold; FIG. 6A illustrates the encapsulated array, and FIG. 6B shows an enlarged view of one unit. Subsequently, compound 601 is fully polymerized. For many device types, the thickness 610 of the molded encapsulation is between 0.2 and 0.7 mm. As the cross sections of FIGS. 6A and 6B show, the encapsulation has apertures 603 to the pad locations. Furthermore, FIGS. 6A and 6B and the top view of FIG. 8C show, the encapsulation has surface grooves 630 extending between selected apertures. Grooves 630 have smooth bottom and sidewalls.

Alternatively, the cavity direct injection molding technique or the liquid compression molding technique may be employed. These techniques also use a plastic film similar to film 232 in FIGS. 2A, 2B and 4, held to the top mold portion by vacuum suction. The recesses in the top mold portion are individually operated by spring-loaded movable pistons, creating individual floating cavities. The application of the metal inserts in the recesses according to the invention is analogous to the application of the inserts depicted in FIG. 4.

FIG. 6B indicates by dashed contour 602 any residual encapsulation formed on the contact pads 103. These thin deposits (thickness 602a between 0 and about 100 μm) have to be removed to expose the clean metal surface of pad 103. At least three methods are suitable to remove these unwanted encapsulation layers.

The first method employs drilling or vaporizing by laser light. A focused laser beam shines into the encapsulation aperture 603, removes the compound layer while forming particles 604 in a thermal process, and deposits these particles on the otherwise smooth sidewalls 603a; particles 604 attest to the thermal process used to clean up the pads. The second method employs a plasma clean-up process; the plasma leaves a roughened surface 605 on the aperture sidewalls 603a. The third method employs a chemical etch process, which leaves a surface structure 606 recognizable by one skilled in the art. All three methods are material-sensitive and thus controllable to stop at the metal surface of the contact pads.

Figure 7:
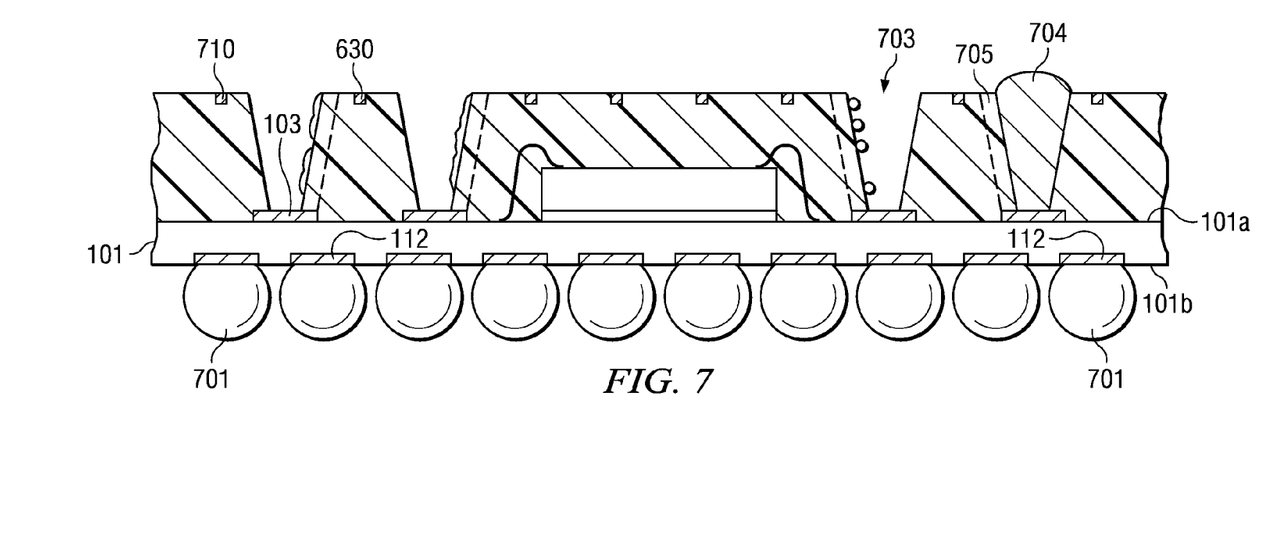
FIG. 7 is a schematic cross section of a discrete device after removing any molding compound from the contact pads, filling an aperture with solder, filling the grooves with metal, and attaching solder bodies for external communication.

In the final process step, illustrated in FIG. 7, the grooves 630 in the encapsulation surface are filled with metal 710, preferably copper, whereby electrically conductive routing interconnections between the apertures are created. Several successful processes are available to fill the grooves with metal. The preferred method includes the steps of plasma cleaning the encapsulation surface; depositing, by electroless plating or by sputtering, a metal layer (for example copper) on the encapsulation surface including the grooves; electrolytically plating metal up to the thickness sufficient to fill the grooves; and grinding the encapsulation surface to remove the metal from the surface except the grooves.

An alternative method includes the steps of plasma cleaning the encapsulation surface; screen printing metal into the grooves, for instance copper; and reflowing the screened metal.

In an additional process step, reflow bodies such as solder balls 701 are attached to the attachment pads 112 (see FIGS. 1A and 1B) on the second substrate surface 101b. This step is illustrated in FIG. 7, showing a magnified portion of the array (it should be noted that in the example of FIG. 7, wire bonding has been employed to assemble the chip on the first substrate surface 101a).

In an optional process step, the mold apertures 703 may be filled with solder paste 704, which contacts the surface of pad metal 103. During the reflow step of the paste, grooves 705 may help to separate the flux-rich part form the solder-rich part.

Figure 8A:
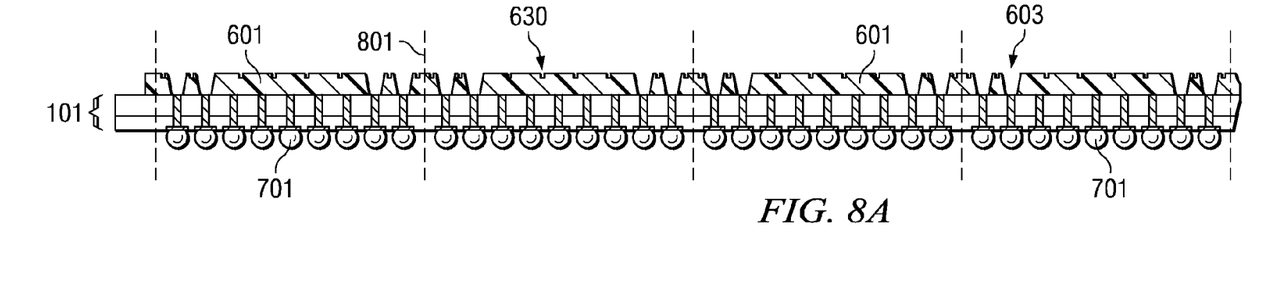
FIG. 8A shows a schematic cross section of a finished array with features according to the invention.
Figure 8B:
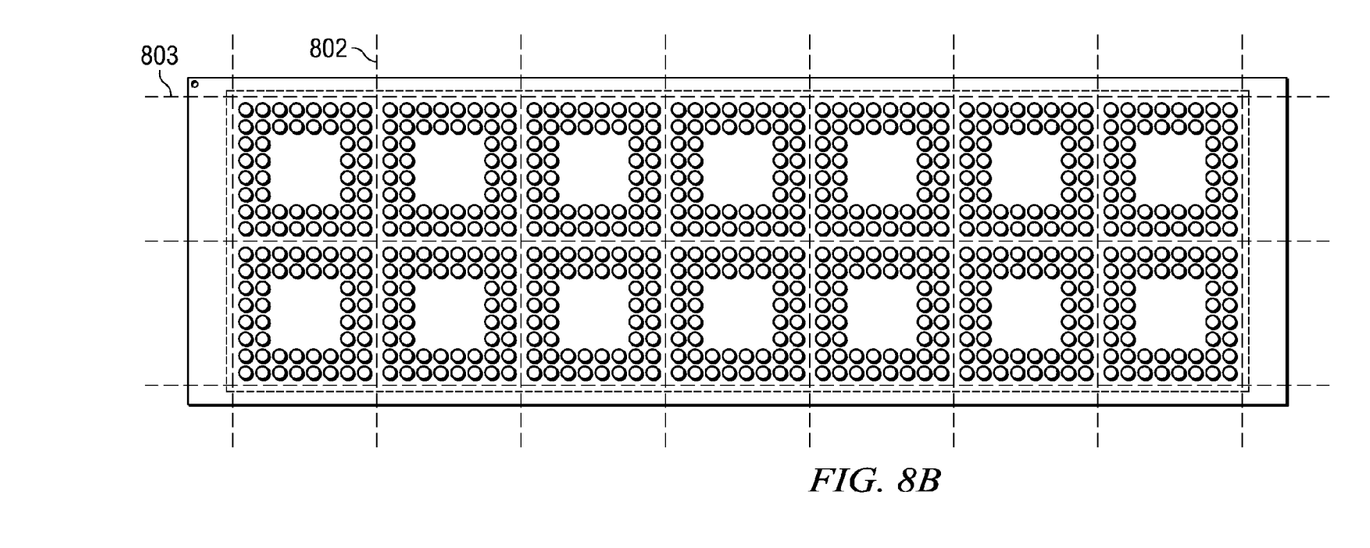
FIG. 8B depicts a schematic top view of a finished array, molded according to the invention, before singulation.
Figure 8C:
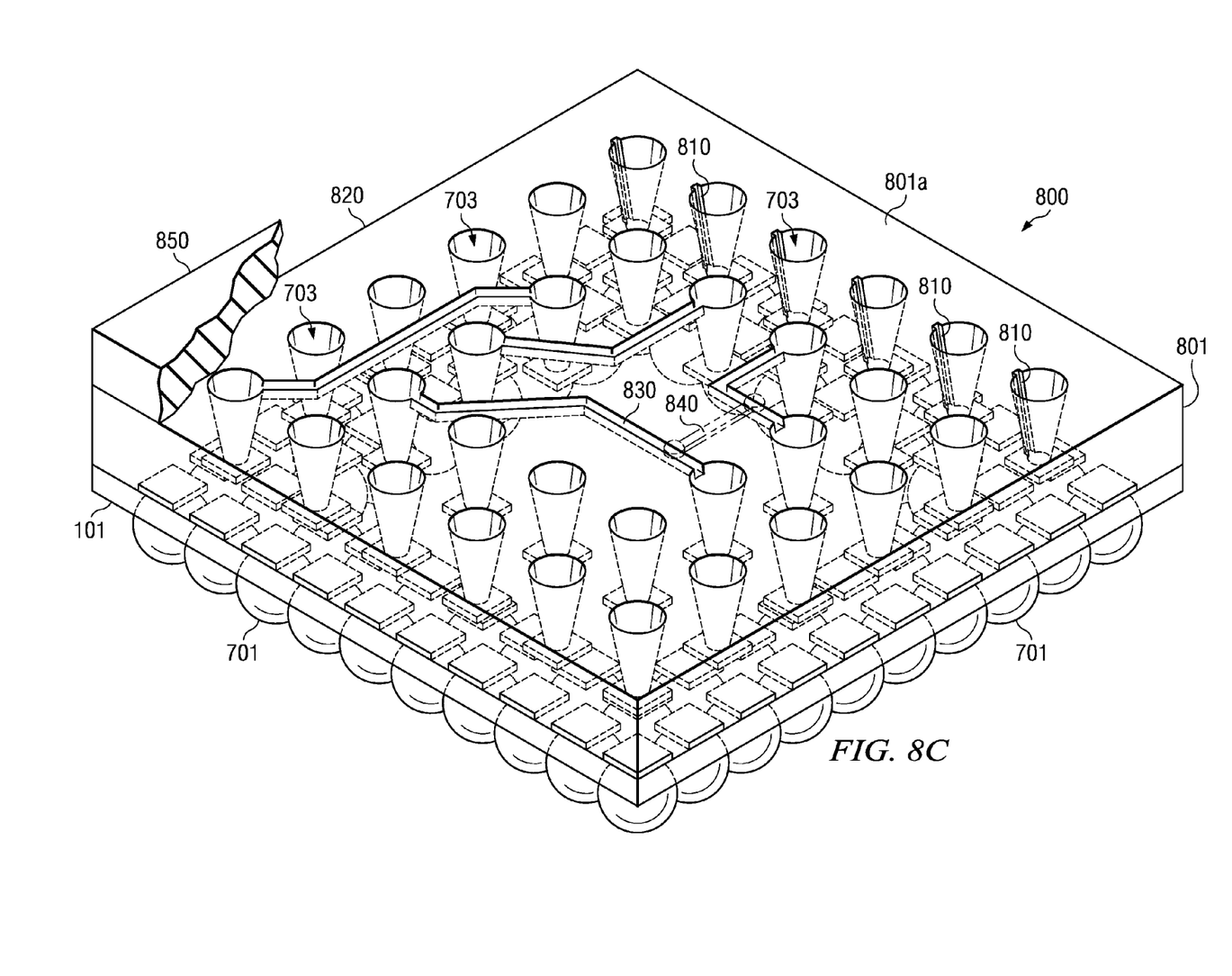
FIG. 8C shows a schematic perspective view of a discrete unit singulated from the molded array with features according to the invention.

FIGS. 8A, 8B, and 8C depict the singulation step. The dashed lines 801 (in the cross section of FIG. 8A), 802 and 803 (in the top view of FIG. 8B) indicate saw lines of saws, which cut through the substrate 101 and the mold compound 601 to singulate discrete units from the sheet-like substrate of the array. Due to the sawing process step, the individual units have recognizable saw marks on their sides.

A discrete unit, generally designated 800, is illustrated in FIG. 8C in a perspective X-ray view. The perimeter of unit 800 is designated 820. The illustration emphasizes the apertures 703 reaching through the thickness of the encapsulation 801 to the contact pads, but omits the encapsulated assembled chip for clarity reasons; in addition, the gas release channels 810 have been omitted for all apertures except for one row of apertures. The surface 801a of the encapsulation includes the metal-filled routing interconnections 830 of the redistribution grooves.

FIG. 8C further indicates the opportunity provided by the redistribution lines, after being filled with metal, to attach additional electrical parts such as passive components on the surface of device 800. Shown in dashed outline, part 840 is a passive component attached to two adjacent metal-filled grooves. Based on the metal-filled redistribution lines 830 on the surface of the molding compound, the invention provides an electrical routing level outside of the insulating substrate or the leadframe, thus providing the additional routing without adding a metallization level to the thickness of the package.

FIG. 8C further indicates the opportunity to add an insulating film 850 over surface of device 800. The film is preferably made of a plastic material, which can tolerate the high temperatures encountered in solder attachment processes. The film has holes in the locations of the openings 703, which need to be available for solder attachment. The film offers the opportunity to add device symbolization to the top of unit 800. Typically, such symbolization informs about the type of device, electrical characteristics, year and location of manufacturing, producer, etc.

Figure 9:
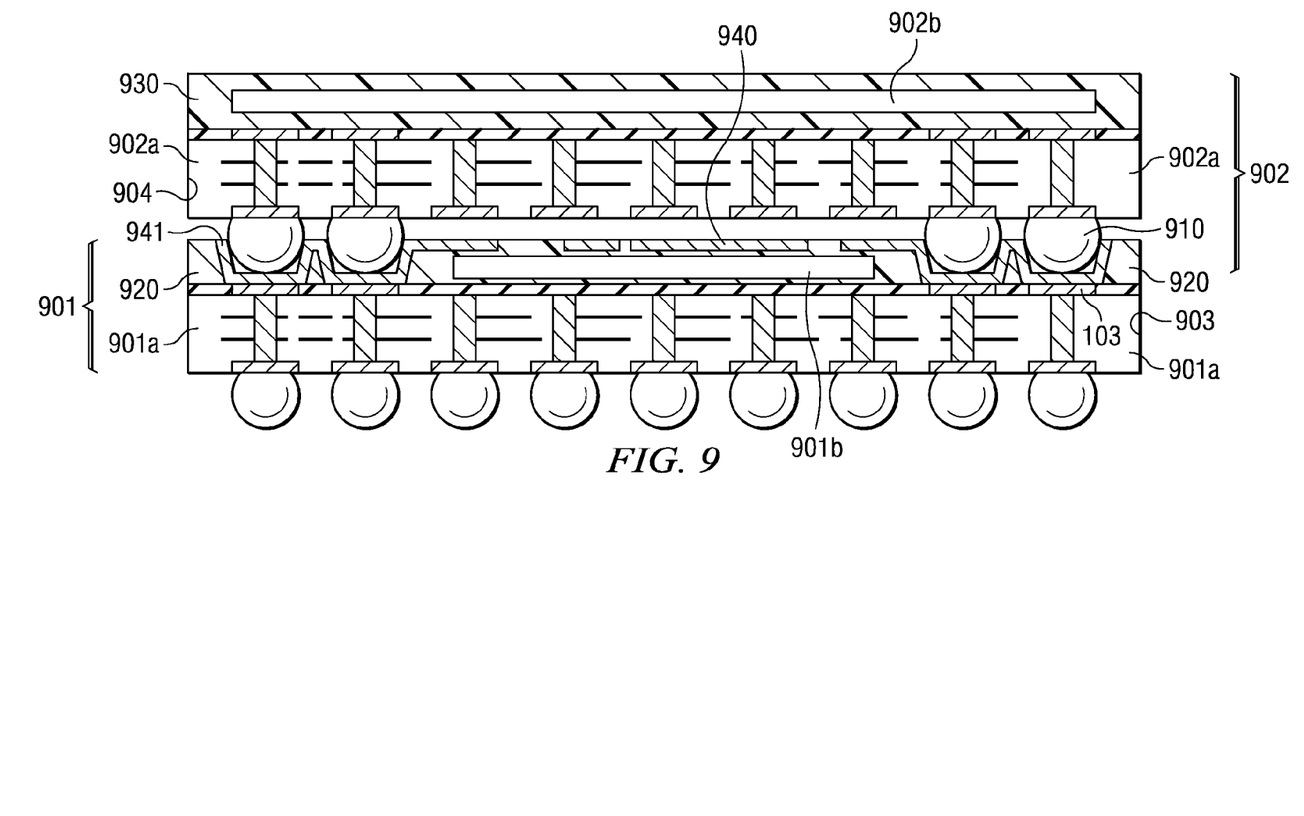
FIG. 9 illustrates a schematic cross section of another embodiment of the invention, wherein a second semiconductor device with solder bodies is attached to the first device (with redistribution lines) so that the aperture-exposed pads of the first device are contacted by the solder bodies of the second device, creating a customized package-on-package semiconductor assembly.

The benefit of the redistribution routing becomes evident, when a package-on-package device has to be built as illustrated in FIG. 9. A first semiconductor package 901, with assembled chip 901b, is manufactured as described above, including the copper-filled redistribution lines 940 and apertures 941, and singulated by sawing from an array-molded substrate (an example of the embodiment has been illustrated in FIG. 8C). A second semiconductor device 902, with a second substrate 902a, assembled chip 902b and with solder bodies 910, is attached to the pads of the first substrate 901a of the first device 901 in order to produce a package-on-package. In this attachment process, the pad surfaces 103 are contacted by the solder bodies 910 of the second device 902.

FIG. 9 emphasizes the preferred combination of devices, wherein not only the molding compound 920 of first device 901 extends to the substrate perimeter 903, but also the molding compound 930 of second device 902 extends to the substrate perimeter 904. This combination minimizes the risk of device warpage in the assembly process.

While the locations of solder balls 910 of device 902 match the contact pads 103 of device 901, the electrical connections to the desired input/output terminals of device 901 are accomplished by redistribution lines 940, created by the metal-filled grooves in the encapsulation 920 of device 901. The electrical connection of device 902 to device 901 is thus customized. This achievement of the redistribution lines 940 provides a high degree of freedom in selecting devices 902 to form package-on-package products with existing devices 901. Furthermore, the batch-processing method of the invention provides a low-cost process for creating the customized electrical connections.

Another embodiment of the invention is an apparatus for the fabrication of a semiconductor device; the apparatus is illustrated in FIGS. 2B and 3B, with more detail illustrated in FIGS. 2A and 3A. A mold has top (201 in FIG. 2A, 210 in FIG. 2B) and bottom (301 in FIG. 3A, 310 in FIG. 3B) portions. The top portion has a cavity with protrusions and recesses for holding semiconductor devices, the bottom portion is without corresponding protrusions and preferably featureless. Preferably, the device includes a semiconductor chip attached to a sheet-like insulating substrate, integral with two or more patterned layers of conductive lines and vias, with contact pads in pad locations. When the mold is operated, it is closed by clamping the top portion onto the bottom portion.

When the cavity direct injection molding technique or the liquid compression molding technique is employed, the recesses in the top mold portion have spring-loaded movable pistons, which can be operated individually so that individual floating cavities are formed.

The top portion includes protrusions (202 in FIG. 2A) at locations matching the pad locations. Preferably, the protrusions are made of the same material (for instance, steel) as the top portion of the mold. The protrusions are preferably shaped as truncated cones of a height suitable to approach the pad metal surface in the closed mold; a preferable distance from the cone to the pad surface is between 0 and about 100 µm. More preferably, the height is suitable to touch the pads metal surface in the closed mold. The angle 202a of the cones is preferably between 10 and 30 degrees from vertical. In addition, it is advantageous to add a ridge to the protrusions (203 in FIG. 2A), which are configured to create, in the molded encapsulation, a gas release channel in the aperture of the contact pads.

The recesses have inserts 230 with ridges 231, which operate to create surface grooves with smooth sidewalls and bottoms in the molded package. After completion of the molding process, which created all grooves simultaneously as a batch process, these grooves will be filled with metal so that they will become electrically conductive redistribution lines between the metal-filled accesses to the contact pads. The redistribution lines embedded in the encapsulation make an additional metal layer for redistribution unnecessary.

Since the inserts are exchangeable, the ridges can be customized to serve exactly the input/output requirements of the devices intended to be coupled in a package-on-package assembly. The degree of freedom to select the devices for the assembly based on the ability to interconnect them in a customized fashion, represents a new opportunity for designing customized package-on-package products.

The inserts are preferably made of a metal such as aluminum or steel so that they can withstand the temperatures and pressures during the molding operation. In addition, it is preferred to include a compliant film positioned over the protrusions and recesses of the top portion and the inserts to prevent molding compound from bleeding during the molding operation. Preferred materials for the compliant film include heat-tolerant and pressure-tolerant silicone and polymers such as kapton in the thickness range between 15 and 500 µm. For the individual spring-loaded pistons of the cavity direct injection mold, the application of the metal inserts in the recesses according to the invention is analogous to the one described above.

The bottom portion of the mold is preferably featureless, in particular in molds for encapsulating whole arrays as shown in FIG. 3B. The bottom part provides support for placing the device substrate in the mold. On the other hand, it may be advantageous for molding discrete devices to have a recess (302 in FIG. 3A) of a certain depth in the bottom part for tightly positioning the device substrate. No molding compound reaches the bottom of the cavity or the bottom surface of the substrate.

Another embodiment of the invention is a semiconductor device, singulated by sawing from an array-molded substrate, and designed to become part of a semiconductor package-on-package device. An example of the embodiment is illustrated in FIG. 8C (a cross section of a magnified portion before singulation is depicted in FIG. 7). A sheet-like insulating substrate 101 has obtained its perimeter 820, preferably by sawing, which leaves recognizable saw marks. The substrate has solder bodies 701 attached.

The embodiment has an encapsulated region on the top of the substrate; the encapsulation material covers the whole top substrate area of the device, including the chip, which is attached on the top surface of the substrate (not shown in FIG. 8C). The encapsulation forms contact apertures 703 at the pad locations for permitting external communication with the pad metal surfaces. The surfaces of the aperture sidewalls include compound structures, which have been modified from the otherwise smooth surface by the process employed to clean up the pad metal surfaces and thus bear witness of the selected process. As an example, when the compound structures on the sidewalls include thermally modified compound particles, such as rounded particles, they indicate that a laser technique has been used to remove an incidental compound layer from the pad surface and thus expose the pad metal. Alternatively, when the aperture sidewalls have a roughened surface, they indicate that a plasma clean-up process has been used to expose the pad metal. In another situation, the aperture sidewalls may have surface structures recognizable by one skilled in the art as residues of a chemical etch process used to expose the pad metal.

The top surface of the encapsulation has one or more metal-filled redistribution lines 830, which connect selected apertures 703. Lines 830 are customized in order to facilitate the package-on-package assembly of selected semiconductor devices. As pointed out in conjunction with FIG. 9, in the preferred combination of devices for the package-on-package assembly extends not only the encapsulation of the first device to the substrate perimeter, but also the encapsulation of the second device. This matched combination minimizes the risk of device warpage in the assembly process.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to products using any type and any number of semiconductor chips, discrete or integrated circuits, and the material of the semiconductor chip may comprise silicon, silicon germanium, gallium arsenide, or any other semiconductor or compound material used in integrated circuit manufacturing.

As another example, the metal protrusions of the top mold portion may be shaped as cylinders, cubes, rhomboids, or any other 3-dimensional configuration. As another example, the depth to which the inserts are positioned in the recesses influences the thickness of the device encapsulation; it thus offers another parameter for modifying the contours of the molded devices.

It is therefore intended that the appended claims encompass any such modifications or embodiment.

We claim:

1. A method for fabricating a semiconductor device comprising the steps of:
   attaching a semiconductor chip to a substrate having a plurality of metallic contact pads;
   forming a sheet of mold compound encapsulating the semiconductor chip;
   forming a plurality of apertures through the sheet of mold compound, each aperture from the plurality of apertures approaching one metallic contact pad from the plurality of metallic contact pads the contact pad positioned at a bottom of each aperture;
   forming a plurality of grooves on a top surface of the sheet; and
   filling the plurality of grooves with metal, thereby creating routing interconnections.

2. The method according to claim 1, wherein the forming of the plurality of apertures and the forming of the plurality of grooves and the forming of the sheet are done concurrently.

3. The method according to claim 2, wherein the plurality of apertures and the plurality of grooves are formed with a top mold die having an insert with a plurality of protrusions.

4. The method according to claim 3, wherein the insert is made of aluminum or steel.

5. The method according to claim 3 further including inserting a compliant film between the top mold die and the insert.

6. The method according to claim 1, further comprising a step of removing mold compound from the bottom of each aperture of the plurality of apertures to expose the metallic contact pads.

7. The method according to claim 6, wherein the removing step includes shining laser light into the plurality of apertures.

8. The method according to claim 6 wherein the removing step includes using plasma.

9. The method according to claim 6 wherein the removing step includes chemical etching.

10. The method according to claim 1 wherein the step of attaching includes wire bonding.

11. The method according to claim 1 wherein the step of attaching includes a flip-chip process.

12. The method according to claim 1 further comprising attaching solder balls to a second substrate surface.

13. The method according to claim 6 further comprising a step of filling the plurality of apertures with a conductive material, thereby electrically interconnecting selected apertures by the metal-filled grooves.

14. The method according to claim 1 further comprising a step of singulating individual units from the substrate.

15. The method according to claim 14, wherein the step of singulating is performed by a sawing process.

16. The method according to claim 13 further comprising attaching a second semiconductor device to the plurality of apertures.

17. The method according to claim 1 further comprising attaching to the sheet with a plastic film for symbolization.

18. The method according to claim 1 further comprising attaching electrical components to the metal-filled grooves.

19. The method according to claim 1, wherein the metal in the grooves includes copper.

20. The method according to claim 1, wherein the step of filling the grooves includes the steps of:
  plasma cleaning a sheet surface;
  depositing, by electroless plating or by sputtering, a metal layer on the sheet surface and in the plurality of grooves;
  electrolytically plating metal up to a thickness sufficient to fill the plurality of grooves; and
  grinding the surface to remove excessive metal from the sheet surface.

21. The method according to claim 1, wherein the step of filling the grooves includes the steps of:
  plasma cleaning a sheet surface;
  screen printing a metallic material into the plurality of grooves; and
  reflowing the metallic material.

* * * * *